(12) United States Patent
Gross

(10) Patent No.: US 10,624,208 B1
(45) Date of Patent: Apr. 14, 2020

(54) LANDING PATTERN FOR BALL GRID ARRAY

(71) Applicant: Arista Networks, Inc., Santa Clara, CA (US)

(72) Inventor: Zev Gross, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

(21) Appl. No.: 16/164,666

(22) Filed: Oct. 18, 2018

(51) Int. Cl.
 H05K 1/11 (2006.01)
 H05K 1/18 (2006.01)
 H05K 3/40 (2006.01)
 H05K 3/42 (2006.01)

(52) U.S. Cl.
 CPC ............. *H05K 1/113* (2013.01); *H05K 1/181* (2013.01); *H05K 3/4007* (2013.01); *H05K 3/42* (2013.01); *H05K 2201/09381* (2013.01); *H05K 2201/09418* (2013.01); *H05K 2201/09609* (2013.01); *H05K 2201/10015* (2013.01); *H05K 2201/10022* (2013.01); *H05K 2201/10734* (2013.01)

(58) Field of Classification Search
 CPC .................. H05K 1/113; H05K 1/181; H05K 2201/09609; H05K 3/42; H05K 3/4007; H05K 2201/09381; H05K 2201/09418; H05K 2201/10734

USPC .................................. 174/260, 262; 361/767
See application file for complete search history.

(56) References Cited

U.S. PATENT DOCUMENTS

| 6,168,854 B1* | 1/2001 | Gibbs | H05K 1/0271 |
| | | | 174/250 |
| 9,635,760 B1* | 4/2017 | Chan | H05K 1/113 |
| 2005/0173151 A1* | 8/2005 | Shepherd | H05K 1/114 |
| | | | 174/250 |
| 2006/0166398 A1* | 7/2006 | Chan | H01L 23/49816 |
| | | | 438/106 |
| 2012/0292088 A1* | 11/2012 | Lee | H05K 1/113 |
| | | | 174/260 |

* cited by examiner

*Primary Examiner* — Sherman Ng
(74) *Attorney, Agent, or Firm* — Fountainhead Law Group PC

(57) ABSTRACT

A printed circuit board for a surface mount device (SMD) is provided. The printed circuit board includes adjacent, opposed first and second lands on a face of the printed circuit board, the first land comprising a first solder pad contacting or merged with a first annular pad of a first via, the second land comprising a second solder pad contacting or merged with a second annular pad of a second via, arranged for solder mounting a surface mount device to the first and second solder pads.

17 Claims, 4 Drawing Sheets

LANDING PATTERN FOR BALL GRID ARRAY

BACKGROUND

Printed circuit boards (PCBs) have been devised for mounting a large variety of integrated circuit packages, including surface mount devices (SMDs) that have ball grid arrays where each contact has a tiny solder ball. With such high density packaging and high density layout printed circuit boards, mounting discrete components such as capacitors and resistors is often done on the bottom side of the printed circuit board, with the integrated circuit packages on the top side. Plated through vias route signal, power or ground lines from one face of the printed circuit board to the other (e.g., through hole vias), from one face to a layer within the printed circuit board (e.g., blind vias) or from one layer to another within the printed circuit board (e.g., buried vias). A dog bone is an often used land (i.e., a physically and electrically continuous conducting region on a face of the printed circuit board) for connecting another layer of the printed circuit board through a via to a component on a face of the printed circuit board. Yet, even with all of these printed circuit board structures available, there is an ongoing need for denser mounting of surface mount devices and mounting of surface mount devices in inaccessible locations for improved proximity to other components, and reduction in parasitic inductance, resistance or capacitance.

SUMMARY

In some embodiments, a printed circuit board for a surface mount device (SMD) is provided. The printed circuit board includes adjacent, opposed first and second lands on a face of the printed circuit board, the first land comprising a first solder pad contacting or merged with a first annular pad of a first via, the second land comprising a second solder pad contacting or merged with a second annular pad of a second via, arranged for solder mounting a surface mount device to the first and second solder pads.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

A printed circuit board structure described herein improves upon the dog bone for more dense placement of vias, diagonal mounting of components, and/or reduction in parasitic resistance, inductance or capacitance, especially but not limited to mounting two terminal surface mount devices such as resistors and capacitors. The structure is applicable for mounting various components to one or both sides of a printed circuit board.

Figure 1:
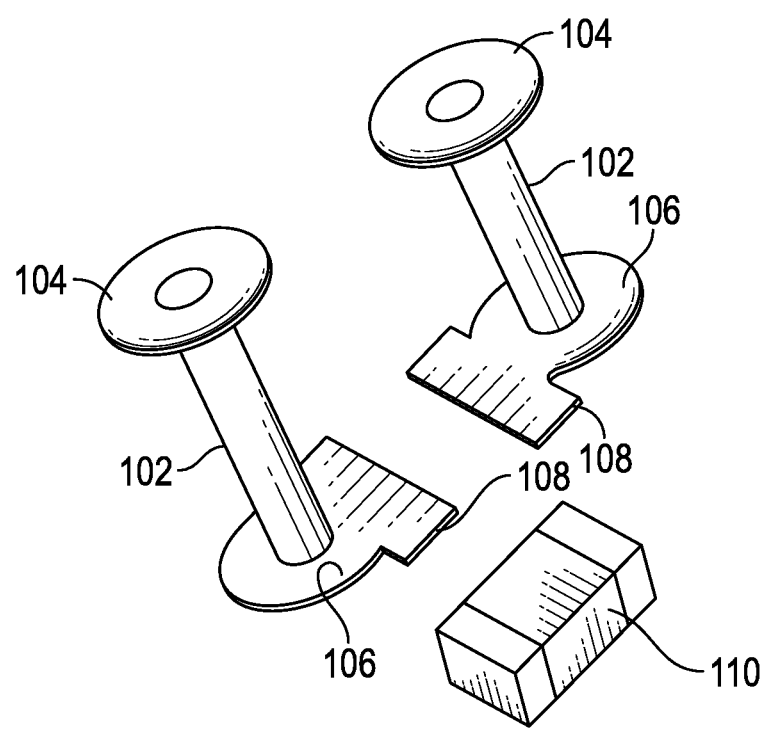
FIG. 1 depicts a printed circuit board structure for mounting surface mount devices that improves upon the standard dog bone in accordance with some embodiments.

FIG. 1 depicts a printed circuit board structure for mounting surface mount devices 110 that improves upon the standard dog bone. To render the structure more clearly visible, the printed circuit board itself is removed from the drawing, or may be thought of as transparent in this depiction. And, although the upper part of the drawing is labeled Top of PCB and the lower part of the drawing is labeled Bottom of PCB, the structure is equally applicable for mounting a surface mount device to either face of a printed circuit board and is readily inverted or reversed top to bottom. Variations for blind vias are readily developed.

Vias 102 are shown as the copper plating that lines the drilled through hole, e.g., as a tall, hollow cylinder, each with an annular (i.e., ring) pad 104 at the top face of the printed circuit board, and another annular pad 106 at the bottom face of the printed circuit board. A rectangular solder pad 108 extends from each annular pad 106 at the bottom face. A two terminal surface mount device 110, for example a capacitor in FIG. 1, is assembled to the structure, with one terminal of the surface mount device 110 soldered to one of the solder pads 108, and the other terminal of the surface mount device 110 soldered to the other solder pad 108 of the structure.

Figure 2:
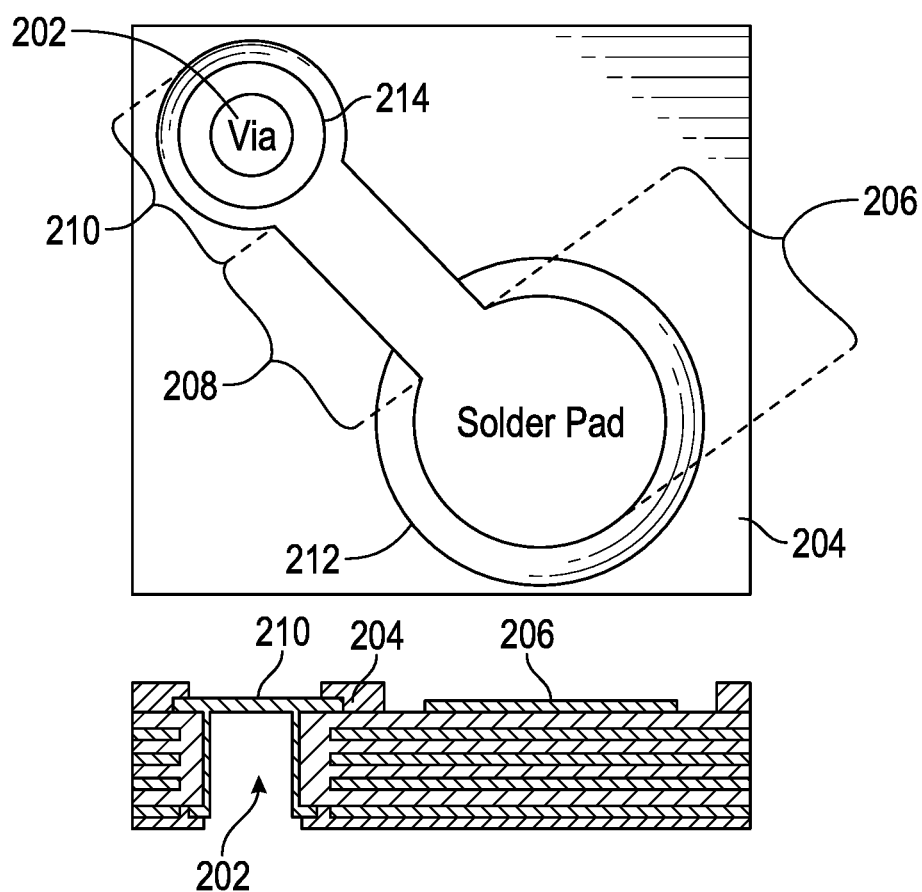
FIG. 2 depicts a dog bone, in top view and cross-section in accordance with some embodiments.

FIG. 2 depicts a dog bone, in top view and cross-section. The dog bone is on the top face of the printed circuit board, but could just as easily be on the bottom face, and is used for connecting a terminal of a surface mount device through the solder pad 206, trace 208, annular pad 210 of the via 202, and the plated walls of the via 202, to another layer connected to the plated walls of the via 202. This other layer could be an intermediate layer in the printed circuit board, or a layer on the opposite face of the printed circuit board. An opening 212 in a solder mask 204 exposes the solder pad 206, and, for clearance and manufacturing tolerances, a portion of the trace 208 that connects the solder pad 206 to the annular pad 210 of the via 202. But, the opening in the solder mask 204 does not extend all the way across the trace 208 to the annular pad 210 of the via 202. Thus, the majority of the trace 208 is protected by the solder mask and is not exposed. Optionally, another opening 214 in the solder mask exposes the annular pad 210 and the copper plated through hole or blind hole of the via 202, so that solder plates the copper of the annular capture pad and the walls of the via 202, and may fill the via, usually depending on the diameter of the hole. For the typical dog bone, the solder pad 206 is circular, the annular pad 210 is circular, and the trace 208 is rectangular, physically and electrically connecting the annular pad 210 and the solder pad 206. The annular pad 210, trace 208 and solder pad 206 form a single, physically and electrically continuous land.

Figure 3:
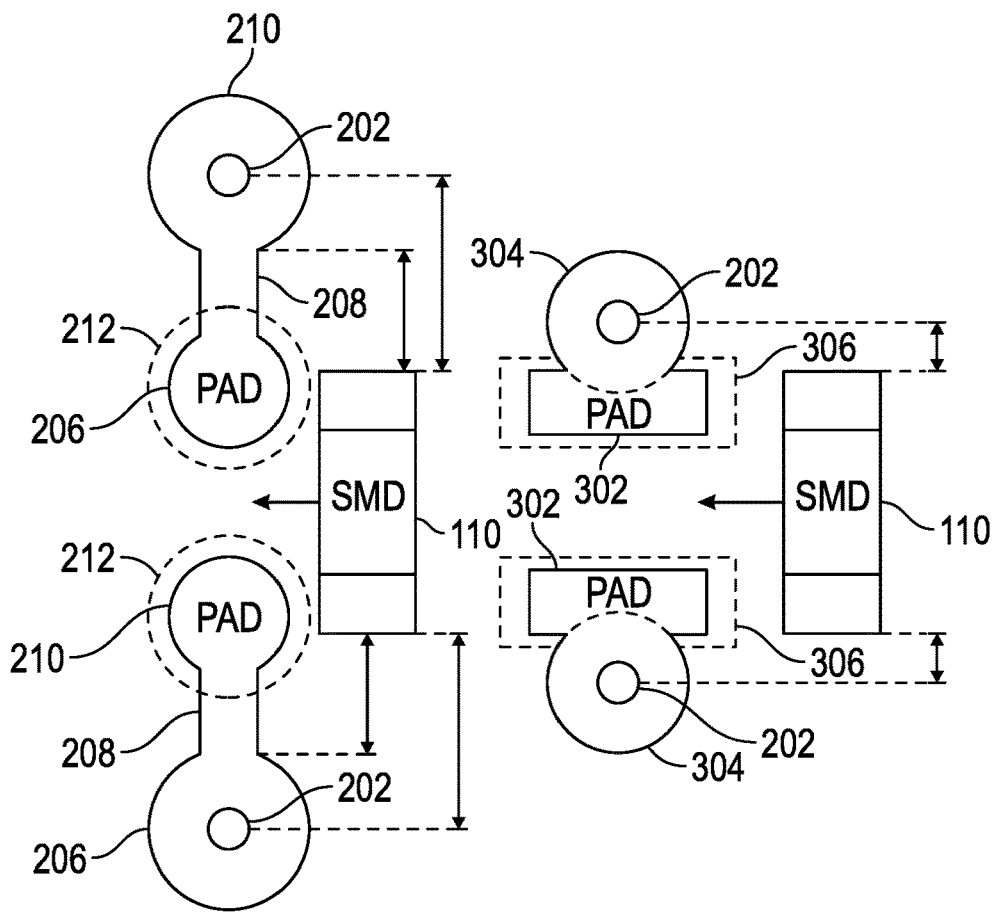
FIG. 3 is a top view of dog bones in comparison to the printed circuit board structure of FIG. 1, with each shown mounting a two terminal surface mount device in accordance with some embodiments.

FIG. 3 is a top view of dog bones in comparison to the printed circuit board structure of FIG. 1, with each shown mounting a two terminal surface mount device 110. To the left in FIG. 3, two standard dog bones are arranged for soldering a surface mount device 110 to the two solder pads 206, one for each terminal of the surface mount device 110. Each solder pad 206 of a dog bone has a solder mask opening 212 exposing the solder pad 206 to receive solder and the respective terminal of the surface mount device 110. Depending upon the length of the trace 208 connecting the solder pad 206 to the annular pad 210 of the via 202, there is a characteristic distance between the end of the surface mount device 110 and the via 202, also a characteristic distance between the end of the surface mount device 110 and the annular pad 210 of the dog bone. Each of these characteristic distances is shown in the drawing as a double-headed arrow.

To the right in FIG. 3, surface features of the printed circuit board structure of FIG. 1 are shown in top view. Each of the two opposing adjacent lands has a rectangular solder pad 302 extending from an annular pad 304 of a via 202. The rectangular solder pad 302 and the annular pad 304 are united, as two parts of one land. That is, the rectangular solder pad 302 and annular pad 304 form a physically and electrically continuous land, without the solder pad 302 and annular pad 304 being separated and connected by a trace as on the standard dog bone. A solder mask opening 306 exposes the solder pad 302. The solder mask opening 306 extends to and touches the annular pad 304, bordering but not exposing the annular pad 304. Because there is no trace 208 connecting a solder pad 206 to an annular pad 210 as on the dog bone, the solder pad 302 is directly contacting or merged with the annular pad 304 of the via 202. That is, the solder pad 302 is not separated from the annular pad 304 by a trace 208. When the surface mount device 110 is soldered to the solder pads 302, the characteristic distance between the end of the surface mount device 110 and the via 202 is much less than the corresponding characteristic distance for a dog bone. And, the characteristic distance between the end of the surface mount device 110 and the annular pad 304 is nominally zero, or very small, and in any case much less than the corresponding characteristic distance for a dog bone. Shrinking these characteristic distances allows tighter placement of surface mount devices 110 relative to vias 202 on a printed circuit board, so that surface mount devices 110 can be placed in heretofore inaccessible locations. One specific use is to place bypass capacitors as surface mount devices 110 across power and ground terminals of a ball grid array surface mount device, with ball grid array surface mount device on one face of the printed circuit board and the surface mount device 110 on the opposing face of the printed circuit board.

During design of a solder pad 302 extended from the annular pad 304 of a via 202, refinements can be made. The solder pad 302 can be a generally rectangular region except for an arc-shaped accommodation of part of the annular pad 304. To refine this shape, for example, the rectangular solder pad 302 could have corners that are rounded, beveled, chamfered or shaved. The region where the annular pad 304 merges with the solder pad 302 could be rounded, filled, flared, expanded or contracted. Area of the solder pad 302 could be increased or decreased. These refinements may take into account the amount and flow of solder for soldering a terminal of the surface mount device 110 to the solder pad 302, and the shape and extent of the terminal. In the embodiment shown in FIG. 3, the solder mask blocks off the annular pad 304 and the via 202, while exposing the solder pad 302, and this prevents the via 202 from pulling solder off of the solder pad 302 while the solder is liquid, which could prevent a high-quality solder connection forming to connect the solder pad 302 to the surface mount device 110.

Figure 4:
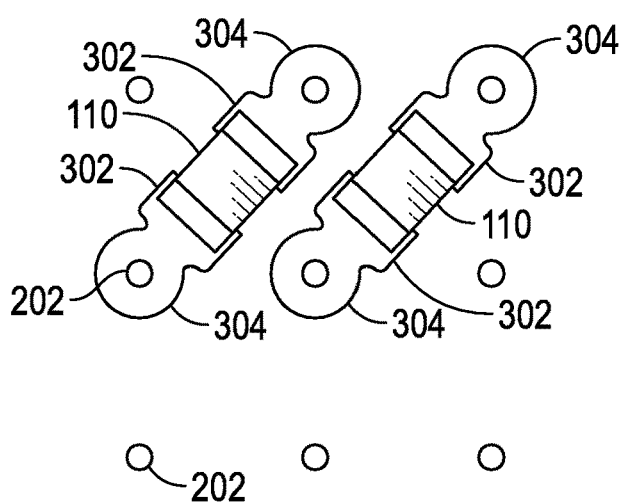
FIG. 4 is a top view of diagonal mounting of two terminal surface mount devices amid a rectangular array of vias, using the printed circuit board structure of FIG. 1 in accordance with some embodiments.

FIG. 4 is a top view of diagonal mounting of two terminal surface mount devices 110 amid a rectangular array of vias 202, using the printed circuit board structure of FIG. 1. Each surface mount device 110 is mounted on a diagonal between two vias 202. This tight spacing and placement of the surface mount devices 110 would not be possible, for the same size surface mount devices and spacing of vias 202 in a rectangular grid, with dog bones as depicted in FIGS. 2 and 3. The characteristic distance between the end of the surface mount device 110 and the via 202 is greater in the dog bone and would not allow such placement, even on a diagonal, for that via spacing.

Figure 5:
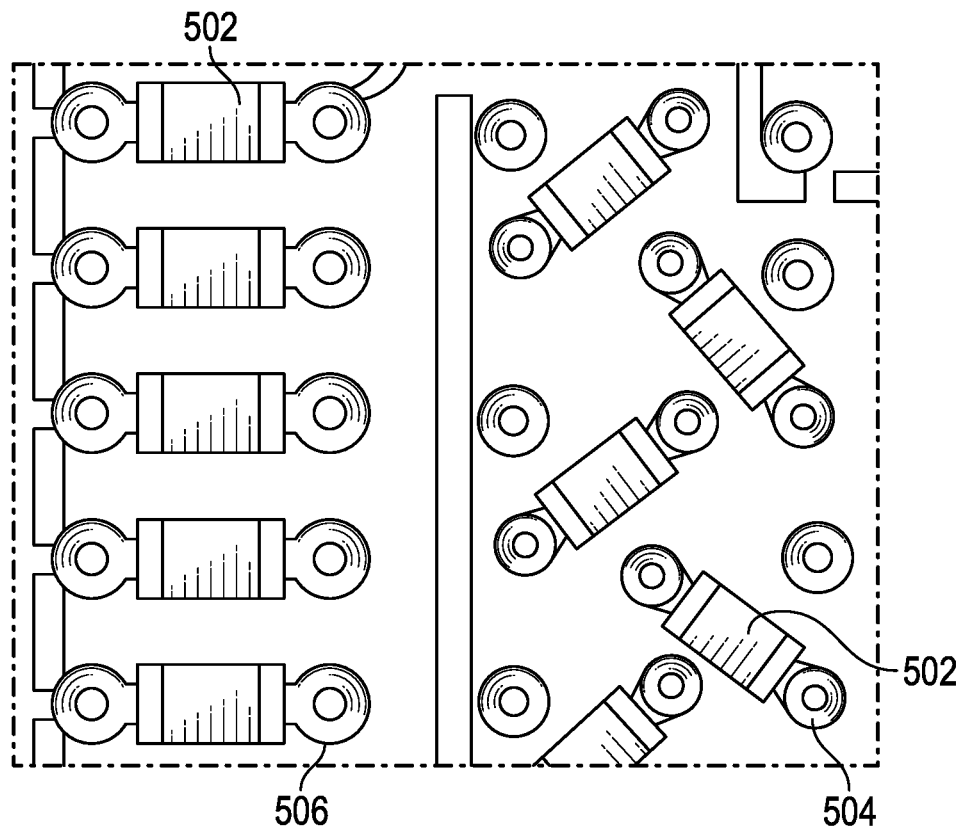
FIG. 5 depicts both the mounting of surface mount devices using dog bones (on the left) and the mounting of surface mount devices using the printed circuit board structure of FIG. 1 (on the right) in accordance with some embodiments.

FIG. 5 depicts both the mounting of surface mount devices using dog bones (on the left) and the mounting of surface mount devices using the printed circuit board structure of FIG. 1 (on the right). Spacing between vias 504 on the right is closer than spacing between vias 506 on the left, in the horizontal direction, because of the tighter spacing allowed by the printed circuit board structure of FIGS. 1, 3 and 5 in comparison to the spacing allowed by the dog bones of FIGS. 2, 3 and 5, and also because of the diagonal mounting of the surface mount devices 502 on the right that is enabled by such tighter spacing. Other placements are possible and readily devised.

Figure 6:
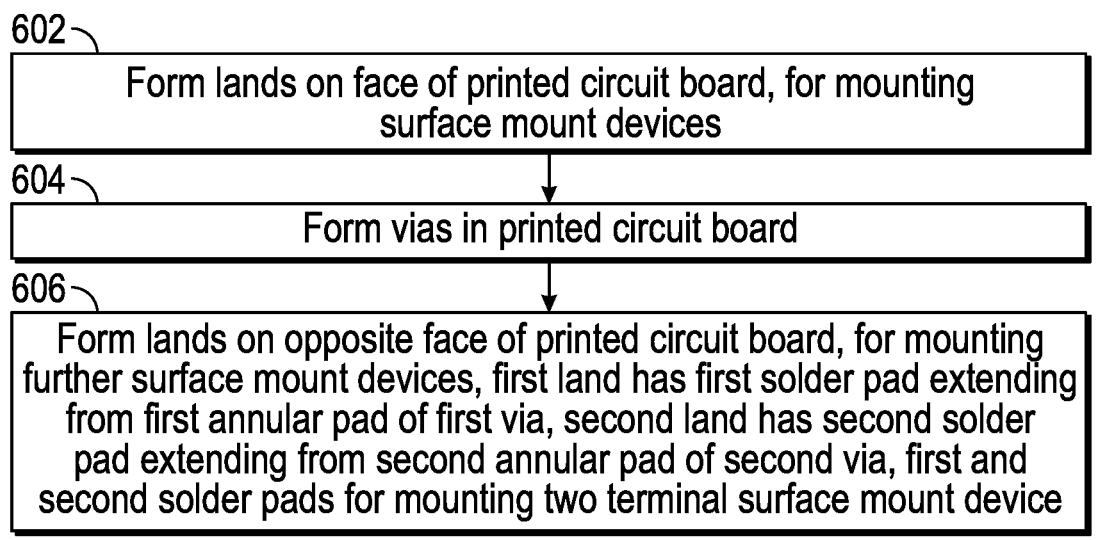
FIG. 6 is a flow diagram of a method of making a printed circuit board, which uses the printed circuit board structure of FIGS. 1, 3, 4 and 5 or variations thereof, in accordance with some embodiments.

FIG. 6 is a flow diagram of a method of making a printed circuit board, which uses the printed circuit board structure of FIGS. 1, 3, 4 and 5 or variations thereof. Once the printed circuit board is made, this can be followed by soldering surface mount devices to the printed circuit board.

In an action 602, lands are formed on a face of the printed circuit board, for mounting surface mount devices. There are many shapes and placements of lands, for traces and pads, and for two layer or multilayer printed circuit boards. Layouts may include placements of pads in arrays for ball grid array surface mount devices.

In an action 604, vias are formed in the printed circuit board. This action may include multiple actions, performed at different times during the making of a printed circuit board, such as drilling of one or more laminate layers, drilling from one face through to the other face of the printed circuit board, copper plating, and application of solder optionally to fill vias.

In an action 606, lands are formed on the opposite face of the printed circuit board, for mounting further surface mount devices. These lands include a first land and a second land. The first land has a first solder pad extending from a first annular pad of a first via. The second land has a second solder pad extending from a second annular pad of a second via. The first and second solder pads are for mounting a two terminal surface mount device. In some embodiments, the two terminal surface mount device is a capacitor, and in further embodiments, the two terminal surface mount device is a resistor. Multiple instances of the first and second lands can be placed for mounting multiple surface mount devices.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks dupad operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory stopad program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufactupad process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A printed circuit board for a surface mount device (SMD), comprising:
   a printed circuit board;
   adjacent, opposed first and second lands on a face of the printed circuit board, the first land comprising a first solder pad contacting or merged with a first annular pad of a first via, the second land comprising a second solder pad contacting or merged with a second annular pad of a second via, arranged for solder mounting a surface mount device to the first and second solder pads; and
   a solder mask on the face of the printed circuit board and having a first aperture exposing the first solder pad and a second aperture exposing the second solder pad, the first aperture touching the first annular pad, the second aperture touching the second annular pad and the solder mask not exposing the first annular pad and the second annular pad.

2. The printed circuit board of claim 1, wherein:
   the first solder pad locates a first terminal of the surface mount device closer to the first annular pad and the first via in comparison to a standard dog bone having a third pad connected by a trace to a third annular pad of a third via; and
   the second solder pad locates a second terminal of the surface mount device closer to the second annular pad and the second via in comparison to the standard dog bone having the third pad connected by the trace to the third annular pad of the third via.

3. The printed circuit board of claim 1, further comprising wherein:
   vias are arranged in a rectangular grid on the printed circuit board; and
   the first and second lands arranged for solder mounting the surface mount device are arranged to mount the surface mount device on a diagonal between the first via and the second via.

4. The printed circuit board of claim 1, wherein the surface mount device comprises a surface mount capacitor.

5. The printed circuit board of claim 1, wherein:
the first solder pad and the first annular pad are united in direct contact and not separated and connected by a trace; and
the second solder pad and the second annular pad are united in direct contact and not separated and connected by a trace.

6. The printed circuit board of claim 1, wherein:
the first solder pad comprises a rectangular extension of the first annular pad; and
the second solder pad comprises a rectangular extension of the second annular pad.

7. A printed circuit board for surface mount devices, comprising:
a printed circuit board having opposed first and second faces;
a plurality of lands to mount multi-terminal surface mount devices on the first face of the printed circuit board;
a plurality of paired lands arranged to mount a surface mount device to each of the plurality of paired lands, on the second face of the printed circuit board,
each of the plurality of paired lands comprising a first solder pad extending from and in contact with a first annular pad of a first via, and a second solder pad extending from and in contact with a second annular pad of a second via, the first and second solder pads positioned for mounting the surface mount device; and
a solder mask with a plurality of openings each exposing a pad, including a first opening exposing the first solder pad and extending to the first annular pad, and a second opening exposing the second solder pad and extending to the second annular pad, the solder mask not exposing the first annular pad and the second annular pad.

8. The printed circuit board of claim 7, wherein:
the first solder pad of each of the plurality of paired lands positions a first terminal of the surface mount device at a lesser distance from the first annular pad and the first via than does a standard dog bone; and
the second solder pad of each of the plurality of paired lands positions a second terminal of the surface mount device at a lesser distance from the second annular pad and the second via than does the standard dog bone.

9. The printed circuit board of claim 7, further comprising:
a plurality of vias, including the first and second via, arranged in a rectangular grid, wherein the first and second solder pads of each of the plurality of paired lands are positioned to mount the surface mount device on a diagonal between the first via and the second via.

10. The printed circuit board of claim 7, wherein:
the first solder pad and the first annular pad comprise a first land without being separated and connected by a trace as on a standard dog bone; and
the second solder pad and the second annular pad comprise a second land without being separated and connected by a trace as on the standard dog bone.

11. The printed circuit board of claim 7, wherein:
the first solder pad comprises a rectangular region except for a first arc-shaped accommodation of a portion of the first annular pad; and
the second solder pad comprises a rectangular region except for a second arc-shaped accommodation of a portion of the second annular pad.

12. A method of making a printed circuit board for surface mount devices, comprising:
forming a plurality of lands on a first face of a printed circuit board, for mounting surface mount devices;
forming a plurality of vias;
forming a further plurality of lands on a second face of the printed circuit board, for mounting further surface mount devices, the further plurality of lands comprising a first land having a first solder pad in contact with and extending from a first annular pad of a first via, and a second land having a second solder pad in contact with and extending from a second annular pad of a second via, the first and second solder pads arranged for mounting a two terminal surface mount device thereto; and
forming a solder mask on the second face of the minted circuit board, the solder mask having a first aperture exposing the first solder pad and bordering a portion of the first annular pad, and having a second aperture exposing the second solder pad and bordering a portion of the second annular pad, the solder mask not exposing the first annular pad and the second annular pad.

13. The method of claim 12, wherein the forming the further plurality of lands comprises;
locating, by placement of the first solder pad, a first terminal of the two terminal surface mount device closer to the first annular pad and the first via in comparison to a standard dog bone; and
locating, by placement of the second solder pad, a second terminal of the two terminal surface mount device closer to the second annular pad and the second via in comparison to the standard dog bone.

14. The method of claim 12, wherein:
the forming the plurality of vias comprises arranging the vias, including the first and second vias, in a rectangular grid on the printed circuit board;
the forming the further plurality of lands comprises arranging the first and second solder pads for mounting the two terminal surface mount device on a diagonal between the first via and the second via.

15. The method of claim 12, wherein the forming the further plurality of lands comprises forming the further plurality of lands for mounting further surface mount devices comprising capacitors, the two terminal surface mount device being one of the capacitors.

16. The method of claim 12, wherein the forming the further plurality of lands comprises:
uniting the first solder pad and the first annular pad, not separating and connecting the first solder pad and the first annular pad by a trace; and
uniting the second solder pad and the second annular pad, not separating and connecting the second solder pad and the second annular pad by a trace.

17. The method of claim 12, wherein the forming the further plurality of lands comprises:
extending the first annular pad to form the first solder pad as a first rectangular extension; and
extending the second annular pad to form the second solder pad as a second rectangular extension.

* * * * *